(12) United States Patent
Rusch et al.

(10) Patent No.: US 7,520,317 B2
(45) Date of Patent: Apr. 21, 2009

(54) ORIENTATION INSENSITIVE COMPACT THERMOSIPHON WITH A REMOTE AUXILIARY CONDENSER

(75) Inventors: David P Rusch, Wiiliamsville, NY (US); Mohinder Singh Bhatti, Amherst, NY (US); Ilya Reyzin, Williamsville, NY (US)

(73) Assignee: Delphi Technologies, Inc, Troy, MI (US)

( * ) Notice: Subject to any disclaimer, the term of this patent is extended or adjusted under 35 U.S.C. 154(b) by 480 days.

(21) Appl. No.: 11/434,645

(22) Filed: May 16, 2006

(65) Prior Publication Data

US 2007/0267182 A1   Nov. 22, 2007

(51) Int. Cl.
*F28D 15/00* (2006.01)
*F28F 7/00* (2006.01)
*H05K 7/20* (2006.01)

(52) U.S. Cl. .............. 165/104.33; 165/104.14; 165/104.21; 165/104.26; 165/80.4; 361/700

(58) Field of Classification Search ............ 165/104.14, 165/104.21, 104.26, 104.33, 80.4; 361/700
See application file for complete search history.

(56) References Cited

U.S. PATENT DOCUMENTS

| | | | |
|---|---|---|---|
| 3,604,503 A | 9/1971 | Feldman, Jr. et al. | 417/49 |
| 3,837,394 A * | 9/1974 | Roberts, Jr. | 165/274 |
| 4,490,993 A * | 1/1985 | Larriva | 62/304 |
| 5,566,751 A * | 10/1996 | Anderson et al. | 165/104.27 |
| 5,587,880 A | 12/1996 | Phillips et al. | 361/687 |
| 6,019,165 A * | 2/2000 | Batchelder | 165/80.3 |
| 6,695,039 B1 * | 2/2004 | Reyzin et al. | 165/104.21 |
| 6,695,041 B2 * | 2/2004 | Lai et al. | 165/104.33 |
| 6,940,717 B2 * | 9/2005 | Shih-Tsung | 361/695 |
| 7,191,820 B2 * | 3/2007 | Chou et al. | 165/10 |
| 7,424,906 B2 * | 9/2008 | Bhatti et al. | 165/80.3 |
| 2001/0050164 A1 * | 12/2001 | Wagner et al. | 165/104.33 |
| 2002/0185263 A1 * | 12/2002 | Wagner et al. | 165/104.33 |
| 2002/0189791 A1 * | 12/2002 | Yang et al. | 165/80.4 |
| 2004/0100771 A1 * | 5/2004 | Luo | 361/700 |
| 2005/0161199 A1 * | 7/2005 | Ma et al. | 165/104.33 |
| 2005/0241804 A1 * | 11/2005 | Lee et al. | 165/80.4 |
| 2006/0196643 A1 * | 9/2006 | Hata et al. | 165/104.33 |
| 2007/0227703 A1 * | 10/2007 | Bhatti et al. | 165/104.26 |
| 2007/0246195 A1 * | 10/2007 | Bhatti et al. | 165/104.33 |
| 2007/0246196 A1 * | 10/2007 | Bhatti et al. | 165/104.33 |
| 2008/0110599 A1 * | 5/2008 | Reyzin et al. | 165/104.33 |
| 2008/0110600 A1 * | 5/2008 | Mikubo et al. | 165/104.33 |

\* cited by examiner

*Primary Examiner*—Cheryl J. Tyler
*Assistant Examiner*—Brandon M Rosati
(74) *Attorney, Agent, or Firm*—Patrick M Griffin

(57) ABSTRACT

A heat exchanger assembly is provided including a primary housing having a plurality of primary condensing fingers extending upwardly from and perpendicular to a horizontal axis and disposed circumferentially about a primary axis. A tube extends radially from the primary axis along the horizontal axis toward a remote housing including remote condensing fingers extending downwardly from and perpendicular to the horizontal axis. The remote condensing fingers are disposed circumferentially about a remote axis extending vertically through the remote housing. The tube interconnects the primary housing and the remote housing and is flexible to facilitate movement of the housings relative to one another.

17 Claims, 2 Drawing Sheets

ORIENTATION INSENSITIVE COMPACT THERMOSIPHON WITH A REMOTE AUXILIARY CONDENSER

BACKGROUND OF THE INVENTION

1. Field of the Invention

The invention relates to a heat exchanger assembly for cooling an electronic device.

2. Description of the Prior Art

The operating speed of computers is constantly being improved to create faster computers. With this, comes an increase in heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips; however, air has a relatively low heat capacity. Thus, liquid-cooled units called LCUs employing a cold plate in conjunction with high heat capacity fluids have been used to remove heat from these types of heat sources. Although, LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing a working fluid housed on the boiler plate of the unit. The boiling of the working fluid constitutes a phase change from liquid-to-vapor state and as such the working fluid of the TCU is considered to be a two-phase fluid. Vapor generated during boiling of the working fluid is then transferred to a condenser, where it is liquefied by the process of film condensation over the condensing surface of the TCU. The heat is rejected into ambient air flowing over the condenser and fins are commonly employed on the condenser to increase the heat transferred from the vapor. The condensed liquid is returned back to the boiler plate by gravity.

Examples of such thermosiphons include U.S. Pat. No. 3,604,503 to Feldman et al., and U.S. Pat. No. 5,587,880 to Phillips et al.

The Feldman patent discloses a heat exchanger assembly including a housing having a boiling portion interconnected to a condensing portion by a flexible tube. The tube is lined with a wicking material so that the boiling portion may be located above or below the condensing portion and remain functional.

The Phillips patent discloses a thermosiphon including a boiling portion and a condensing portion connected by tubes, and a refrigerant which undergoes liquid-to-vapor-to-condensate transformation throughout the evaporator and condenser. The assembly also includes an electric heater which operates when the assembly is in an upside down position in order to create frothing of the condensate in the tubes directly below the condensing portion to bring the liquid refrigerant back up to the boiling portion without the use of gravity by way of bubbles.

Although the prior art effectively dissipates heat from electronic devices, there is a continuing need for alternative designs for effectively dissipating heat from electronic devices. Specifically, there is a need for alternative designs for orientation insensitive thermosiphons that can operate in more orientations than conventional orientation insensitive thermosiphons without the use of wicking material, electronic controls, pumps, or electric heaters.

SUMMARY OF THE INVENTION AND ADVANTAGES

The invention provides a heat exchanger assembly for cooling an electronic device comprising a primary housing having a primary center axis. The primary housing includes a boiling portion extending radially from the primary center axis and a plurality of primary condensing fingers extending axially from the boiling portion in an upward direction from a horizontal axis extending radially from the primary housing. The assembly also includes a remote housing having a remote center axis and including a condensing portion extending radially from the remote center axis and a plurality of remote condensing fingers extending axially from the condensing portion in a downward direction from the horizontal axis. A tube extends radially from the primary center axis and along the horizontal axis from the boiling portion of the primary housing to the condensing portion of the remote housing. The tube is flexible for moving the housings relative to one another.

The invention provides an alternative design for an orientation insensitive thermosiphon that can operate in more orientations than conventional orientation insensitive thermosiphons without the use of wicking material, electronic controls, pumps, or electric heaters. Furthermore, the primary housing can be moved relative to the remote housing for packaging convenience as well as for operability in more orientations.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
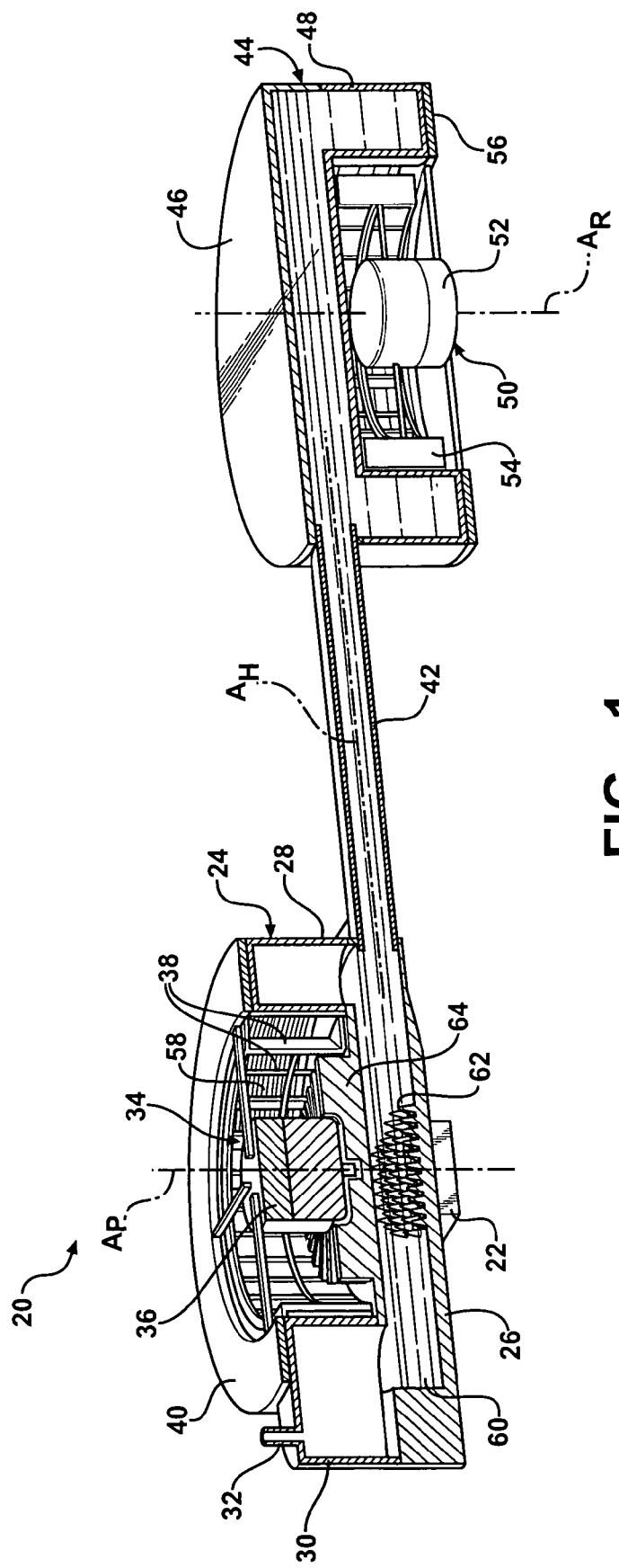
FIG. 1 is a perspective view partially in cross-section of a preferred embodiment of the invention in cross-section.

Referring to the Figures, wherein like numerals indicate corresponding parts throughout the several views, an assembly 20 is generally shown for cooling an electronic device 22.

The assembly 20 includes a primary housing 24 generally indicated having a primary center axis $A_P$ and including a boiling portion 26 extending radially from the primary center axis $A_P$. A plurality of primary condensing fingers 28 extends axially from and perpendicular to the boiling portion 26 and are spaced from one another circumferentially about the primary center axis $A_P$. A condensing extension 30 extends radially from one of the primary condensing fingers 28 to facilitate condensation when the primary housing 24 is in a vertical position. The condensing extension 30 includes a port 32 that can be used to fill or empty the assembly 20.

A primary air moving device 34 generally indicated is disposed along the primary center axis $A_P$ with the primary condensing fingers 28 surrounding the primary air moving device 34 for moving air radially through spaces between adjacent primary condensing fingers 28. The primary air moving device 34 is a centrifugal fan and includes a primary motor 36, a plurality of primary fan blades 38 disposed about the primary motor 36, and a primary support cage 40 disposed on the primary condensing fingers 28 for supporting the primary motor 36.

A tube 42 extends radially from the primary center axis $A_P$ and along a horizontal axis $A_H$ from the boiling portion 26 of the primary housing 24 opposite the condensing extension 30. The tube 42 has a constant oval cross-section but may have a non-uniform cross-section of numerous shapes including circular.

A remote housing 44 generally indicated is disposed at a distal end of the tube 42 wherein the tube 42 interconnects the primary housing 24 and the remote housing 44. The remote housing 44 has a remote center axis $A_R$ and includes a condensing portion 46 extending radially from the remote center axis $A_R$. A plurality of remote condensing fingers 48 extend axially from and perpendicular to the condensing portion 46 of the remote housing 44 and are spaced from one another circumferentially about the remote center axis $A_R$.

A remote air moving device 50 generally indicated is disposed along the remote center axis $A_R$ with the remote condensing fingers 48 surrounding the remote air moving device 50 for moving air radially through spaces between adjacent remote condensing fingers 48. The remote air moving device 50 is a centrifugal fan and includes a remote motor 52, a plurality of remote fan blades 54 disposed about the remote motor 52, and a remote support cage 56 disposed on the remote condensing fingers 48 for supporting the remote motor 52.

Figure 2:
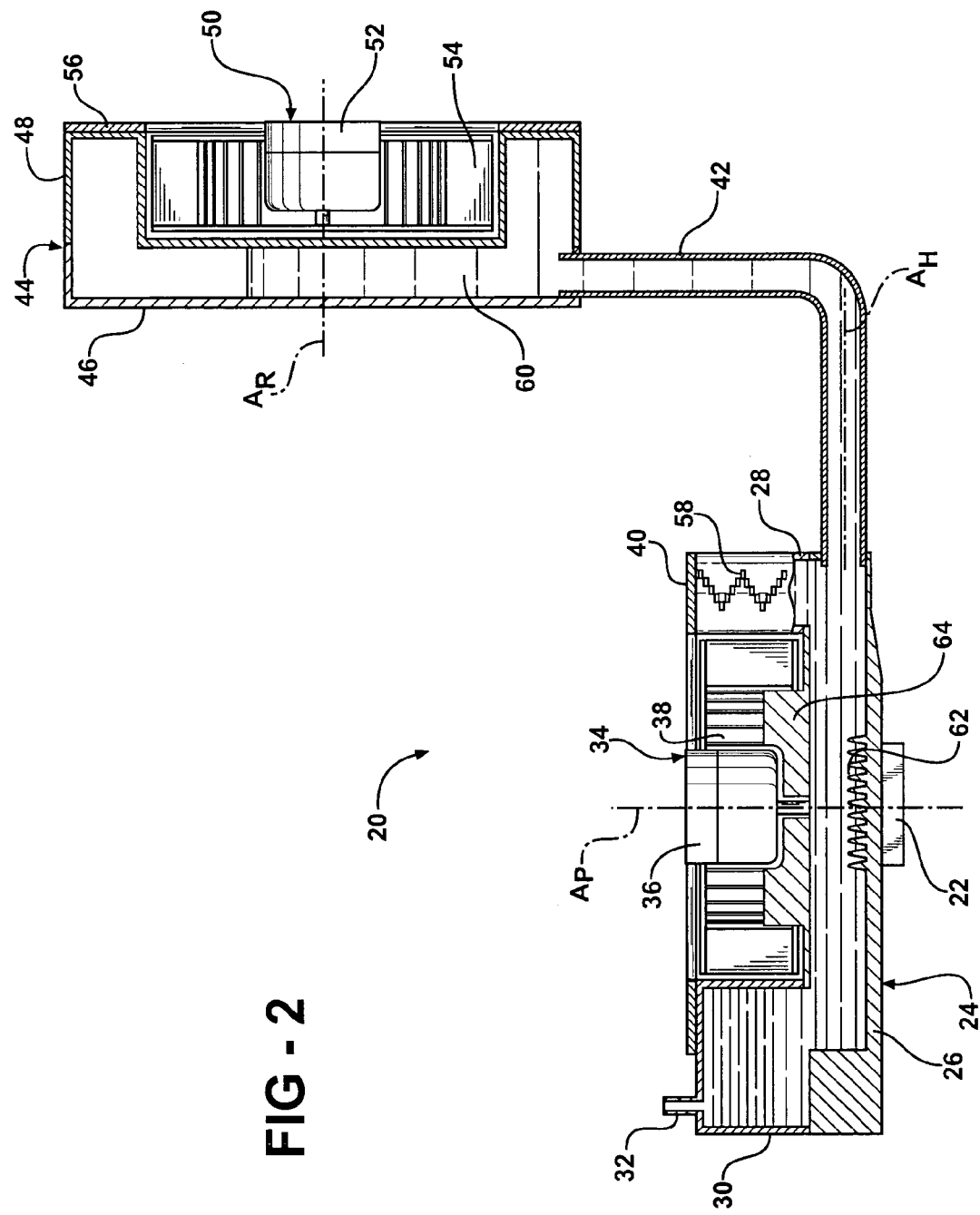
FIG. 2 is a side view of the embodiment of FIG. 1 in cross-section and partially cut away illustrating the tube bent at a 90° angle.

A plurality of air heat transfer fins 58 extend between the adjacent condensing fingers 28, 48 for dissipating heat from the condensing fingers 28, 48 to air moving across the air fins 58. The air fins 58 are convoluted and extend the length of the condensing fingers 28, 48. FIG. 2 is partially cut away to illustrate the air fins 58 in cross-section.

A refrigerant 60 is disposed in the boiling portion 26 of the primary housing 24, in the tube 42, and in the condensing portion 46 and remote condensing fingers 48 of the remote housing 44 for liquid-to-vapor-to-condensate transformation within the boiling portion 26 of the primary housing 24. The refrigerant 60 has a liquid volume greater than the volume of the primary condensing fingers 28 plus the volume of the boiling portion 26 plus the volume of the tube 42 plus the volume of the condensing portion 46 of the remote housing 44. This facilitates boiling of the refrigerant 60 when the assembly 20 is in an upside down position by causing the refrigerant 60 to thermally contact the electronic device 22.

A plurality of boiler heat transfer fins 62 are disposed in the boiling portion 26 of the primary housing 24 for transferring heat from the electronic device 22 to the refrigerant 60 in the boiling chamber. The boiler heat transfer fins 62 are conical and are arranged in close proximity to one another along a floor of the boiling portion 26. The boiler fins 62 are disposed centrally within the boiling portion 26 to maintain thermal contact with the refrigerant 60 when the assembly 20 is in all orientations.

A plurality of radial heat transfer fins 64 are disposed on a top wall of the boiling portion 26 of the primary housing 24 for transferring heat from the refrigerant 60 to air moving over the radial fins 64. The radial fins 64 extend radially from the primary center axis $A_P$ and are spaced circumferentially about the primary center axis $A_P$.

The assembly 20 is distinguished by the primary condensing fingers 28 of the primary housing 24 extending in an upward direction from and perpendicular to the horizontal axis $A_H$ and the remote condensing fingers 48 of the remote housing 44 extending in a downward direction from and perpendicular to the horizontal axis $A_H$ and by the tube 42 being flexible for moving the housings 24, 44 relative to one another. FIG. 2 illustrates the tube 42 being bent at a right angle placing the remote housing 44 above the primary housing 24.

In operation, heat generated from the electronic device 22 is transferred into the boiler fins 62 and thereafter into the refrigerant 60 causing the refrigerant 60 to boil. Depending on the orientation of the assembly 20 and the orientation of the tube 42, vapor will travel into the condensing fingers 28 that face upwardly. For example, in an upright position with the tube 42 in a straight orientation, vapor boiled off of the refrigerant 60 rises into the primary condensing fingers 48 whereas, in an upside down position with the tube 42 in a straight orientation, vapor rises into the remote condensing tubes 42. Heat is then transferred from the condensing fingers 28, 48 into the air fins 58 and thereafter dissipated into air moving over the air fins 58 causing the vapor to condense. The condensate moves back into the boiling portion 26 of the primary housing 24 or into the condensing portion 46 of the remote housing 44 by gravity to continue the liquid-to-vapor-to-condensate cycle thus avoiding the need for wicking material, electronic controls, pumps, or electric heaters.

Obviously, many modifications and variations of the present invention are possible in light of the above teachings. The invention may be practiced otherwise than as specifically described within the scope of the appended claims.

What is claimed is:

1. An assembly for cooling an electronic device comprising;
   a primary housing having a primary center axis and including a boiling portion extending radially from said primary center axis and a plurality of primary condensing fingers extending axially from said boiling portion,
   a remote housing having a remote center axis and including a condensing portion extending radially from said remote center axis and a plurality of remote condensing fingers extending axially from said condensing portion,
   a tube extending radially from said primary center axis and along a horizontal axis from said boiling portion of said primary housing to said condensing portion of said remote housing,
   said primary condensing fingers of said primary housing extending in an upward direction from said horizontal axis and said remote condensing fingers of said remote housing extending in a downward direction from said horizontal axis, and
   said tube being flexible for moving said housings relative to one another.

2. An assembly as set forth in claim 1 including a refrigerant disposed in said boiling portion of said primary housing and said tube and said condensing portion and said remote condensing fingers of said remote housing for liquid-to-vapor-to-condensate transformation within said boiling portion of said primary housing.

3. An assembly as set forth in claim 2 wherein said primary condensing fingers and remote condensing fingers extend perpendicular to said horizontal axis.

4. An assembly as set forth in claim 3 wherein said plurality of primary condensing fingers are spaced from one another circumferentially about said primary center axis.

5. An assembly as set forth in claim 4 including a condensing extension extending radially from one of said primary condensing tubes for facilitating condensation when said primary housing is in a vertical position.

6. An assembly as set forth in claim 5 including a primary air moving device disposed along said primary center axis with said primary condensing fingers surrounding said primary air moving device for moving air radially through spaces between adjacent primary condensing fingers.

7. An assembly as set forth in claim 6 wherein said primary air moving device includes a primary motor and a plurality of primary fan blades disposed about said primary motor and a primary support cage disposed on said primary condensing fingers for supporting said primary motor.

8. An assembly as set forth in claim 3 wherein said remote condensing fingers are spaced from one another circumferentially about said remote center axis.

9. An assembly as set forth in claim 8 including a remote air moving device disposed along said remote center axis with said remote condensing fingers surrounding said remote air moving device for moving air radially through spaces between adjacent remote condensing fingers.

10. An assembly as set forth in claim 9 wherein said remote air moving device includes a remote motor and a plurality of remote fan blades disposed about said remote motor and a remote support cage disposed on said remote condensing fingers for supporting said primary motor.

11. An assembly as set forth in claim 2 wherein said tube has an oval cross-section.

12. An assembly as set forth in claim 2 wherein said refrigerant has a liquid volume greater than the volume of said primary condensing fingers plus the volume of said boiling portion of said primary housing plus the volume of said tube plus the volume of said condensing portion of said remote housing.

13. An assembly as set forth in claim 2 including a plurality of air heat transfer fins extending between adjacent condensing fingers for dissipating heat from said condensing fingers to air moving across said air fins.

14. An assembly as set forth in claim 2 including a plurality of boiler heat transfer fins disposed in said boiling portion for transferring heat from the electronic device to said refrigerant in said boiling chamber.

15. An assembly as set forth in claim 14 wherein said boiler heat transfer fins (62) are conical.

16. An assembly as set forth in claim 1 including a plurality of radial heat transfer fins disposed on said boiling portion of said primary housing for dissipating heat from said refrigerant to air moving over said radial fins.

17. A heat exchanger assembly for cooling an electronic device comprising;

a primary housing having a primary center axis and including a boiling portion extending radially from said primary center axis and a plurality of primary condensing fingers extending axially from said boiling portion and spaced from one another circumferentially about said primary center axis, a primary air moving device disposed along said primary center axis with said primary condensing fingers surrounding said primary air moving device for moving air radially through spaces between adjacent primary condensing fingers, said primary air moving device including a primary motor and a plurality of primary fan blades disposed about said primary motor and a primary support cage disposed on said primary condensing fingers for supporting said primary motor, a remote housing having a remote center axis and including a condensing portion extending radially from said remote center axis and a plurality of remote condensing fingers extending axially from said condensing portion and spaced from one another circumferentially about said remote center axis, a remote air moving device disposed along said remote center axis with said remote condensing fingers surrounding said remote air moving device for moving air radially through spaces between adjacent remote said primary condensing fingers and remote condensing fingers, said remote air moving device including a remote motor and a plurality of remote fan blades disposed about said remote motor and a remote support cage disposed on said remote condensing fingers for supporting said remote motor, a plurality of air heat transfer fins extending between said adjacent condensing fingers for dissipating heat from said primary condensing fingers and remote condensing fingers to air moving across said air fins, a tube having an oval cross-section and extending radially from said primary center axis and along a horizontal axis from said boiling portion of said primary housing to said condensing portion of said remote housing, a refrigerant disposed in said boiling portion of said primary housing and said tube and said condensing portion and said remote condensing fingers of said remote housing for liquid-to-vapor-to-condensate transformation within said boiling portion of said primary housing, said refrigerant having a liquid volume greater than the volume of said primary condensing fingers plus the volume of said boiling portion plus the volume of said tube plus the volume of said condensing portion of said remote housing, and a plurality of boiler heat transfer fins disposed in said boiling portion for transferring heat from the electronic device to said refrigerant in said boiling chamber, said boiler heat transfer fins being conical, a plurality of radial heat transfer fins disposed on said boiling portion of said primary housing for dissipating heat from said refrigerant to air moving across said radial fins, said primary condensing fingers of said primary housing extending in an upward direction from and perpendicular to said horizontal axis and said remote condensing fingers of said remote housing extending in a downward direction from and perpendicular to said horizontal axis, and said tube being flexible for moving said housings relative to one another.

* * * * *